(12) United States Patent
Matsuyama

(10) Patent No.: US 9,930,450 B2
(45) Date of Patent: Mar. 27, 2018

(54) AUDIO APPARATUS, AND CURRENT CONTROL METHOD

(71) Applicant: ALPINE ELECTRONICS, INC., Shinagawa-ku, Tokyo (JP)

(72) Inventor: Minoru Matsuyama, Iwaki (JP)

(73) Assignee: ALPINE ELECTRONICS, INC., Tokyo (JP)

( * ) Notice: Subject to any disclaimer, the term of this patent is extended or adjusted under 35 U.S.C. 154(b) by 0 days.

(21) Appl. No.: 15/151,630

(22) Filed: May 11, 2016

(65) Prior Publication Data
US 2016/0360315 A1 Dec. 8, 2016

(30) Foreign Application Priority Data

Jun. 2, 2015 (JP) ................. 2015-112355

(51) Int. Cl.
*H03G 11/00* (2006.01)
*H04R 3/00* (2006.01)
(Continued)

(52) U.S. Cl.
CPC .......... *H04R 3/007* (2013.01); *H03F 1/0211* (2013.01); *H03F 3/183* (2013.01); *H03F 3/21* (2013.01); *H03G 3/3005* (2013.01); *H03G 7/002* (2013.01); *H03G 7/06* (2013.01); *H03G 7/08* (2013.01); *H04R 29/001* (2013.01); *H03F 2200/03* (2013.01); *H03F 2200/462* (2013.01);
(Continued)

(58) Field of Classification Search
CPC .......... H03F 1/0211; H03F 3/21; H03F 3/183; H03F 2200/471; H03F 2200/462; H03F 2200/465; H03F 2200/03; H04R 29/001; H04R 3/007; H04R 2499/13; H03G 7/08; H03G 3/3005; H03G 7/002; H03G 7/06

USPC ............ 381/55, 58, 59, 120; 330/2; 73/647, 73/646, 645; 714/47.1
See application file for complete search history.

(56) References Cited

U.S. PATENT DOCUMENTS

| 5,831,515 A * | 11/1998 | Stewart | G08B 3/10 340/384.4 |
| 2009/0161889 A1* | 6/2009 | Magrath | H03G 7/007 381/107 |
| 2012/0223980 A1* | 9/2012 | Hollevoet | H02M 3/156 345/690 |

FOREIGN PATENT DOCUMENTS

| DE | 102012014310 | 5/2014 |
| JP | 2008-244554 | 10/2008 |
| JP | 2009-253955 | 10/2009 |

OTHER PUBLICATIONS

Extended European Search Report for 16172171.7 dated Nov. 8, 2016, 10 pgs.

\* cited by examiner

*Primary Examiner* — Vivian Chin
*Assistant Examiner* — Con P Tran
(74) *Attorney, Agent, or Firm* — Brinks Gilson & Lione

(57) ABSTRACT

An audio apparatus includes a signal processor, a power amplifier, a speaker, and a controller. A current consumption prediction unit in the controller predicts current consumption on the basis of a monitoring result of an output level monitoring unit in the signal processor and/or a monitoring result of a power supply voltage monitoring unit in the controller. A limiter control unit in the controller controls a limiter in the signal processor in a normal mode or a current limiting mode on the basis of predicted current consumption. In the current limiting mode, the limiter is controlled so
(Continued)

that an attenuation speed higher than that in the normal mode and a threshold value smaller than that in the normal mode are obtained.

18 Claims, 6 Drawing Sheets

(51) Int. Cl.
    *H03G 3/30*     (2006.01)
    *H03G 7/00*     (2006.01)
    *H03G 7/06*     (2006.01)
    *H03G 7/08*     (2006.01)
    *H03F 1/02*     (2006.01)
    *H03F 3/183*     (2006.01)
    *H03F 3/21*     (2006.01)
    *H04R 29/00*     (2006.01)

(52) U.S. Cl.
    CPC .. *H03F 2200/465* (2013.01); *H03F 2200/471* (2013.01); *H04R 2499/13* (2013.01)

AUDIO APPARATUS, AND CURRENT CONTROL METHOD

RELATED APPLICATION

The present application claims priority to Japanese Patent Application Number 2015-112355, filed Jun. 2, 2015, the entirety of which is hereby incorporated by reference.

BACKGROUND

1. Field of the Invention

The present invention relates to an audio apparatus for outputting an audio signal, and, more particularly, to control of current consumption in an audio apparatus for use in a vehicle.

2. Description of the Related Art

In audio apparatuses installed in mobile units such as vehicles, the number of channels of an amplifier is increasing and the output power of the amplifier is therefore becoming higher. With the increasingly higher output power, a relatively large current is supplied to an audio apparatus. On the other hand, when a trouble such as a short circuit occurs in an audio apparatus, it is necessary to protect an electronic circuit from an overcurrent. Japanese Unexamined Patent Application Publication No. 2008-244554 discloses a technique for protecting a power amplifier from an overcurrent by determining the occurrence of an overcurrent due to a short circuit, activating a limiter circuit when determining that an overcurrent has occurred, limiting the amplitude of an audio signal input into a power amplifier at a stage subsequent to the limiter circuit, and reducing the amount of power consumption of the power amplifier.

Because of the increase in the output power of a power amplifier in an audio apparatus for use in a vehicle and the increase in the number of channels of the power amplifier, a large current may be consumed and a fuse may be blown in a case where rated power is output from all channels. In order to prevent the blowout of a fuse at the time of the output of big sound, it is necessary to limit current consumption. Under the present circumstances, a digital signal processor (DSP) for performing signal processing for an audio apparatus reduces power consumption by estimating the value of an output current and decreasing the threshold value (amplitude) of a limiter so as to prevent an output current from exceeding a predetermined value or by measuring a voltage across a small resistor inserted into a power-supply line to measure a current and decreasing the threshold value (amplitude level) of a limiter at the time of occurrence of a large current.

FIG. 1 illustrates a waveform H1 of a voltage supplied from a battery, a waveform H2 of a consumption current of a power amplifier, and an output waveform H3 of a speaker. In general, a DC voltage of 12 V is supplied from a battery to an audio apparatus, and the waveform of the supplied voltage is represented by H1. In a case where audio signals having rated power are output from all channels of a power amplifier in an audio apparatus, current consumption markedly increases as represented by, for example, the waveform H2 at a time T1. Since a large current flows at that time, voltage from the battery temporarily decreases. From the fact that audio signals are output from all channels of a power amplifier or a voltage drop exceeding a predetermined level occurs at a power-supply line from the battery, it is estimated that current consumption exceeds a predetermined value at the time T1 as described above. The levels of the audio signals are therefore reduced to a predetermined level by a limiter. In the example illustrated in FIG. 1, since it is estimated that relatively large power is consumed in a period from the time T1 to a time T2, the amplitude of the voltage waveform H3 representing the output of a speaker is clamped at a predetermined level. After the time T2, a limiter is deactivated and the voltage waveform H3 has no clamped portion.

However, in the case of the control of power consumption in an audio apparatus in the related art, the blowout of a fuse does not occur but sound is sometimes stopped because of a voltage drop at a power-supply line. The length of a power-supply line from the battery to an amplifier in a vehicle may be 2 m or more. When a large current flows through this power-supply line, a voltage drop occurs. The power supply voltage of the amplifier therefore falls below an operating voltage and sound is stopped.

Furthermore, in a case where the control speed of a limiter is low, the blowout of a fuse occurs. It is desired that the threshold value (amplitude level) of a limiter be rapidly decreased to reduce the output of an amplifier in a case where the flow of a large current is detected. However, a limiter is also usually used to reduce a distortion. An attenuation speed tends to be set to a slow speed from the viewpoint of sound tuning, because sound quality is reduced in a case where an attenuation speed is markedly increased during a normal operation. However, the setting of a slow attenuation speed may lead to a delay in performing current control and cause the blowout of a fuse. On the other hand, the occurrence of blowout of a fuse can be prevented by increasing the rated value of the fuse. However, in a case where the rated value of a fuse is increased, a large current flows in the event of trouble and may cause a fire. It is therefore difficult to increase the rated value of a fuse more than necessary. Furthermore, in order to increase the rated value of a fuse, it is necessary to increase the thickness of a power-supply line.

SUMMARY

It is an object of the present disclosure to provide an audio apparatus, a current control program, and a current control method with which a current-limiting-oriented mode is selected in a case where current consumption exceeds a target current and a sound-quality-oriented mode is selected in a case where current consumption does not exceed a target current.

An audio apparatus according to an embodiment of the present invention includes an output unit configured to output an audio signal, a prediction unit configured to predict current consumption of the output unit, a determination unit configured to determine whether the predicted current consumption exceeds a target current, a limiting unit configured to limit an audio signal in a case where an audio signal exceeds a threshold value, and a control unit configured to control the limiting unit in a first mode in a case where it is determined that the predicted current consumption does not exceed a target current and control the limiting unit in a second mode in a case where it is determined that the predicted current consumption exceeds a target current. In the second mode, the control unit causes the limiting unit to limit an audio signal at an attenuation speed higher than that in the first mode.

In the second mode, the control unit preferably causes the limiting unit to limit an audio signal using a threshold value smaller than that in the first mode. The limiting unit preferably includes a limiter configured to limit a level of an input audio signal. In the second mode, the control unit preferably changes an attenuation speed and a threshold value for the limiter. The control unit preferably changes the threshold value in accordance with a difference between the predicted current consumption and the target current. The limiter preferably includes an amplifier configured to attenuate or amplify an audio signal and a gain adjustment unit configured to compare an attenuated or amplified audio signal with a threshold value and adjust a gain of the amplifier on the basis of a comparison result. The control unit preferably changes a threshold value for the gain adjustment unit and a gain of the gain adjustment unit in the second mode. The prediction unit preferably includes an output monitoring unit configured to monitor a signal output from a signal processing unit for processing an audio signal and predicts current consumption on the basis of a monitoring result of the output monitoring unit.

The prediction unit preferably includes a power supply voltage monitoring unit configured to monitor a voltage of a power-supply line to be supplied to an audio apparatus and predicts current consumption on the basis of a voltage monitored by the power supply voltage monitoring unit. The prediction unit preferably detects the amount of voltage drop monitored by the power supply voltage monitoring unit. The control unit preferably changes the threshold value in accordance with the detected amount of voltage drop. The prediction unit preferably predicts current consumption on the basis of monitoring results of the output monitoring unit and the power supply voltage monitoring unit. The prediction unit preferably includes a weighting unit configured to assign weights based on a monitoring result of the power supply voltage monitoring unit to current consumption predicted on the basis of a monitoring result of the output monitoring unit. The output monitoring unit preferably monitors a signal output from the signal processing unit at first intervals. The power supply voltage monitoring unit preferably monitors a voltage at second intervals shorter than the first interval. The output unit preferably includes an amplifier having a plurality of channels. The prediction unit preferably predicts power consumption on the basis of the number of channels used. The power-supply line is preferably a power-supply line extending from a battery. A fuse is preferably provided at the power-supply line. The target current is preferably set in accordance with a rated current of the fuse.

A current control program according to an embodiment of the present invention executed by a control unit in an audio apparatus including a processing unit for processing an audio signal, an output unit for outputting an audio signal processed by the processing unit, and a control unit for controlling the processing unit includes predicting current consumption of the output unit, determining whether the predicted current consumption exceeds a target current, and controlling the processing unit in a first mode in a case where it is determined that the predicted current consumption does not exceed a target current and controlling the processing unit in a second mode in a case where it is determined that the predicted current consumption exceeds a target current. In the second mode, the processing unit limits an audio signal at an attenuation speed higher than that in the first mode.

A current control method according to an embodiment of the present invention in an audio apparatus including a processing unit for processing an audio signal, an output unit for outputting an audio signal processed by the processing unit, and a control unit for controlling the processing unit includes predicting current consumption of the output unit, determining whether the predicted current consumption exceeds a target current, and controlling the processing unit in a first mode in a case where it is determined that the predicted current consumption does not exceed a target current and controlling the processing unit in a second mode in a case where it is determined that the predicted current consumption exceeds a target current. In the second mode, the processing unit limits an audio signal at an attenuation speed higher than that in the first mode.

According to an embodiment of the present invention, it is determined whether an estimated current consumption exceeds a target current. In a case where it is determined that the estimated current consumption does not exceed the target current, current control is performed in a first mode. In a case where it is determined that the estimated current consumption exceeds the target current, current control is performed in a second mode. In the second mode, since an attenuation speed faster than that in the first mode is set, the current consumption that exceeds the target current can be limited in a short time and the occurrence of trouble such as the blowout of a fuse can be prevented. On the other hand, in the first mode set in a case where the estimated current consumption does not exceed the target current, since a slow attenuation speed can be set, the deterioration of sound quality can be suppressed.

DETAILED DESCRIPTION OF THE PREFERRED EMBODIMENTS

Next, embodiments of the present invention will be described in detail with reference to the accompanying drawings. In a preferred embodiment of the present invention, an audio apparatus is installed in a vehicle that is a mobile unit and operates using power supplied from a battery. However, an audio apparatus does not necessarily need to be installed in a vehicle and may be installed in another place. Furthermore, an audio apparatus according to an embodiment of the present invention may be embedded in an electronic apparatus for use in a vehicle. For example, an electronic apparatus for use in a vehicle outputs an audio signal from an audio apparatus according to an embodiment of the present invention when having a function of reproducing an audio signal and a video signal, a function of receiving a television broadcast and a radio broadcast, and a navigation function.

Embodiments

Figure 1:
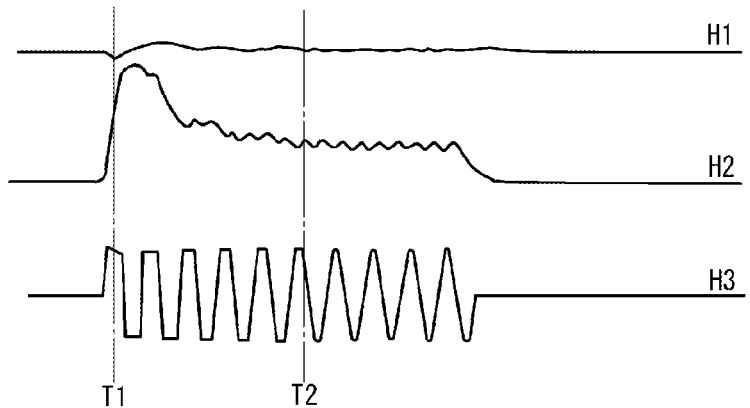
FIG. 1 is a diagram illustrating the waveform of a power supply voltage, the waveform of current consumption, and the output waveform of a speaker for the purpose of the description of current control in an audio apparatus.
Figure 2:
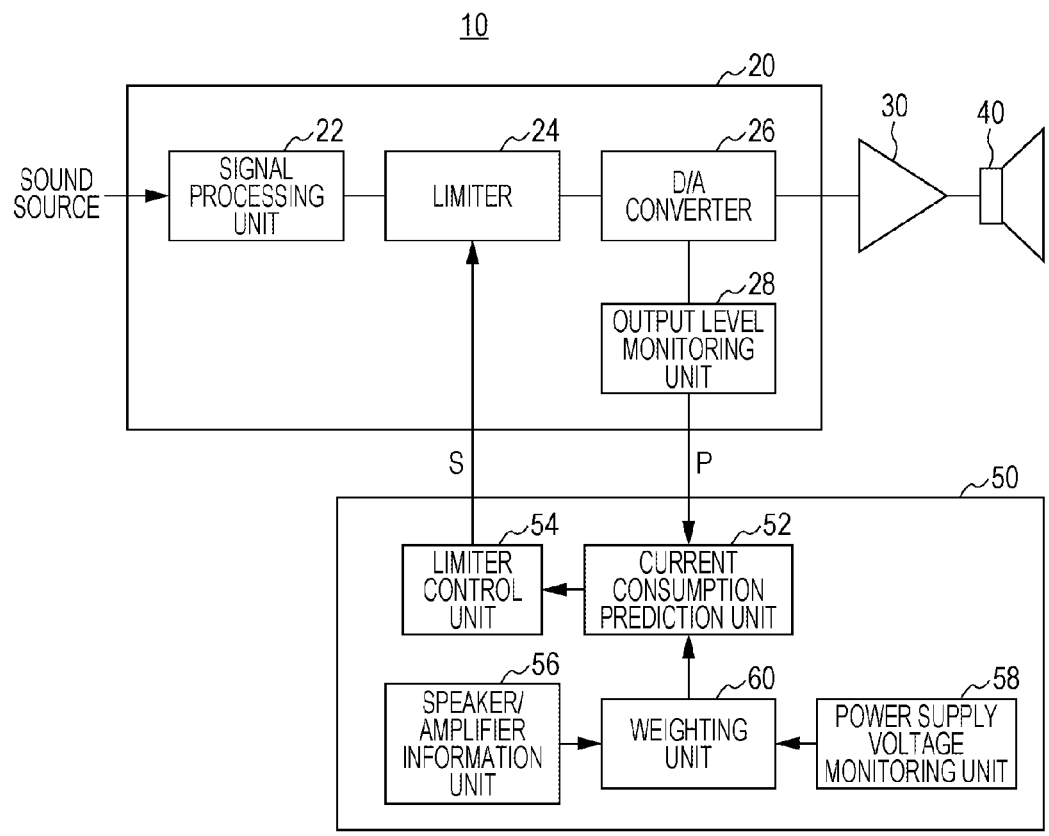
FIG. 2 is a block diagram illustrating an exemplary configuration of an audio apparatus according to a first embodiment of the present invention.

FIG. 2 is a block diagram illustrating an exemplary configuration of an audio apparatus according to a first embodiment of the present invention. An audio apparatus 10 according to an embodiment of the present invention includes a signal processor 20 for receiving an audio signal from a sound source and processing the received audio signal, a power amplifier 30 for amplifying an audio signal output from the signal processor 20, a speaker 40 for converting an audio signal output from the power amplifier 30 into audible sound, and a controller 50 for controlling the signal processor 20.

The signal processor 20 includes a signal processing unit 22 for performing various pieces of processing upon an input audio signal, a limiter 24 for receiving an audio signal processed by the signal processing unit 22 and controlling the level of the audio signal, a digital-to-analog (D/A) converter 26 for converting an audio signal output from the limiter 24 into an analog signal, and an output level monitoring unit 28 for monitoring the level of an audio signal to be output from the signal processor 20. The signal processor 20 is formed of, for example, a digital signal processor (DSP), and the controller 50 is formed of, for example, a central processing unit (CPU). Although a single limiter (the limiter 24) is illustrated, a limiter 24 is provided for each channel of the power amplifier 30.

Figure 3A:
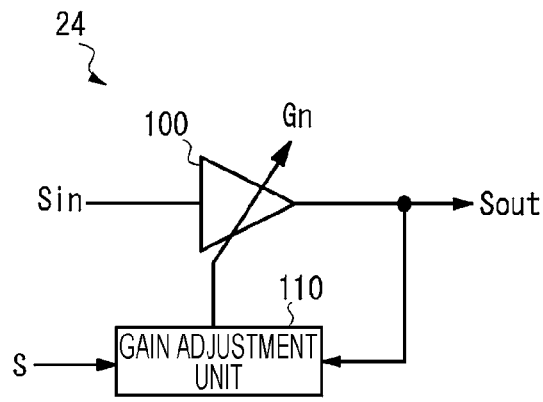
FIG. 3A is an equivalent circuit diagram of a limiter illustrated in FIG. 2.
Figure 3B:
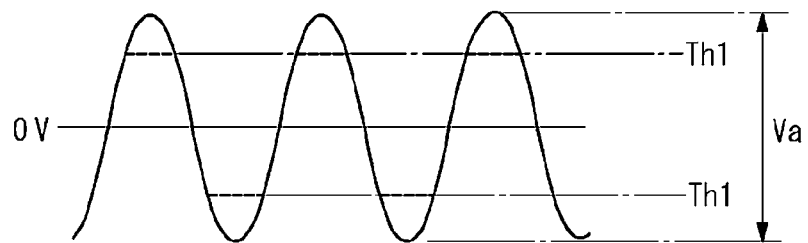
FIG. 3B is a diagram describing the adjustment of a gain.

For example, the signal processing unit 22 decodes a coded audio signal and performs surround processing upon an audio signal. The limiter 24 controls the level of an input audio signal. FIG. 3A is an equivalent circuit diagram of the limiter 24. The limiter 24 includes an amplifier 100 for receiving an audio signal Sin, amplifying or attenuating the audio signal Sin, and outputting an audio signal Sout and a gain adjustment unit 110 for adjusting a gain Gn of the amplifier 100 using a threshold value. The gain adjustment unit 110 compares the audio signal Sout and a threshold value Th. In the case of Th<Sout, the gain adjustment unit 110 increases the gain Gn. In the case of Th>Sout, the gain adjustment unit 110 decreases the gain Gn. For example, as illustrated in FIG. 3B, in a case where the audio signal Sout is larger than a threshold value Th1, the gain Gn is reduced so that an amplitude level Va of the input audio signal Sin does not exceed the threshold value Th1. On the other hand, in a case where the audio signal Sout is smaller than the threshold value Th1, the gain Gn is increased so that the input audio signal Sin does not exceed the threshold value Th1. In this embodiment, the gain adjustment unit 110 changes a threshold value and an attenuation speed used when the gain Gn is reduced on the basis of a limiter control signal S transmitted from the controller 50.

The output level monitoring unit 28 monitors the output level of an audio signal to be output from the signal processor 20 and the presence of an audio signal to be supplied to each channel of the power amplifier 30 on the basis of a result of processing of the signal processing unit 22. For example, in a case where all channels of the power amplifier 30 are used, the signal processor 20 outputs audio signals corresponding to these channels. The output level monitoring unit 28 preferably calculates not the peak value of an audio signal but the root-mean-square value of an audio signal and outputs a result of the calculation as one of the monitoring results. A monitoring result P of the output level monitoring unit 28 is transmitted to a current consumption prediction unit 52 in the controller 50.

Referring to FIG. 2, the D/A converter 26 is included in the signal processor 20, but may be connected to the outside of the signal processor 20. The power amplifier 30 may be a digital power amplifier. In this case, a D/A converter is connected to a stage subsequent to the power amplifier 30.

The controller 50 includes the current consumption prediction unit 52 for predicting the current consumption of the power amplifier 30, a limiter control unit 54 for controlling the limiter 24 on the basis of a result of prediction performed by the current consumption prediction unit 52, a speaker/amplifier information unit 56 for storing information about specifications (for example, power consumption and rated power) of the power amplifier 30 and the speaker 40, a power supply voltage monitoring unit 58 for monitoring a power supply voltage, and a weighting unit 60 for assigning weights to the current consumption prediction unit 52 on the basis of a result of storage of the speaker/amplifier information unit 56 and/or a monitoring result of the power supply voltage monitoring unit 58.

The current consumption prediction unit 52 reads out a predicted current from a monitoring result P of the output level monitoring unit 28 and predicts the current consumption of an audio apparatus. The current consumption prediction unit 52 preferably reads out a predicted current from the monitoring result P of the output level monitoring unit 28 at regular intervals, for example, at intervals of 50 ms and calculates current consumption.

The power supply voltage monitoring unit 58 monitors the voltage of a power-supply line of a battery connected to an audio apparatus and detects whether a voltage drop exceeding a predetermined level has occurred at the power-supply line. The power supply voltage monitoring unit 58 preferably monitors a power supply voltage at intervals shorter than those at which the current consumption prediction unit 52 reads out a predicted current form the monitoring result P of the output level monitoring unit 28, for example, at intervals of 1 ms. A monitoring result of the power supply voltage monitoring unit 58 is supplied to the weighting unit 60. For example, in a case where it is detected that a voltage drop exceeding a predetermined level has occurred at a power-supply line, it means that a large current has flowed from a battery to the audio apparatus 10. The weighting unit 60 therefore provides a weighting factor $\alpha 1$ with which current consumption is somewhat increased for the current consumption prediction unit 52. For example, when current consumption calculated on the basis of the monitoring result P of the output level monitoring unit 28 is Wa, a weighted current consumption is represented by current consumption $W = Wa \times \alpha 1$ where $\alpha 1 \geq 1$ is satisfied. The weighting factor $\alpha 1$ is changed in accordance with the voltage of the power-supply line.

In a case where it is determined that the rated power of a speaker and/or an amplifier is equal to or larger than a predetermined value or the impedance of a speaker is equal to or larger than a predetermined value on the basis of information stored in the speaker/amplifier information unit 56, it can be predicted that the current consumption of a speaker and/or an amplifier will be large. The weighting unit 60 therefore provides a weighting factor α2 with which current consumption is somewhat increased for the current consumption prediction unit 52. At that time, a weighted current consumption is represented by the current consumption W=Wa×α2 where α2≥1 is satisfied. In a case where the assignment of weights is performed using two factors α1 and α2, a weighted current consumption is represented by the current consumption W=(α1+α2)×Wa. The weighting unit 60 may calculate the weighting factors α1 and α2 using a table or an expression prepared in advance.

The current consumption prediction unit 52 predicts current consumption on the basis of a monitoring result of the output level monitoring unit 28 and a result of weighting of the weighting unit 60 and supplies a prediction result to the limiter control unit 54. The limiter control unit 54 controls the limiter 24 on the basis of current consumption predicted by the current consumption prediction unit 52. The limiter control unit 54 compares a target current set on the basis of the rated current of a power-supply line or a fuse connected to an audio apparatus and the predicted current consumption with each other. In a case where the predicted current consumption does not exceed the target current, the limiter control unit 54 outputs a limiter control signal S used to control the limiter 24 in a normal mode. In a case where the predicted current consumption exceeds the target current, the limiter control unit 54 outputs a limiter control signal S used to control the limiter 24 in a current limiting mode. In the current limiting mode, by setting a threshold value smaller than that in the normal mode for the limiter 24 and increasing the attenuation speed of the limiter 24, the limiter 24 is controlled so that current consumption rapidly falls below the target current.

Figure 4:
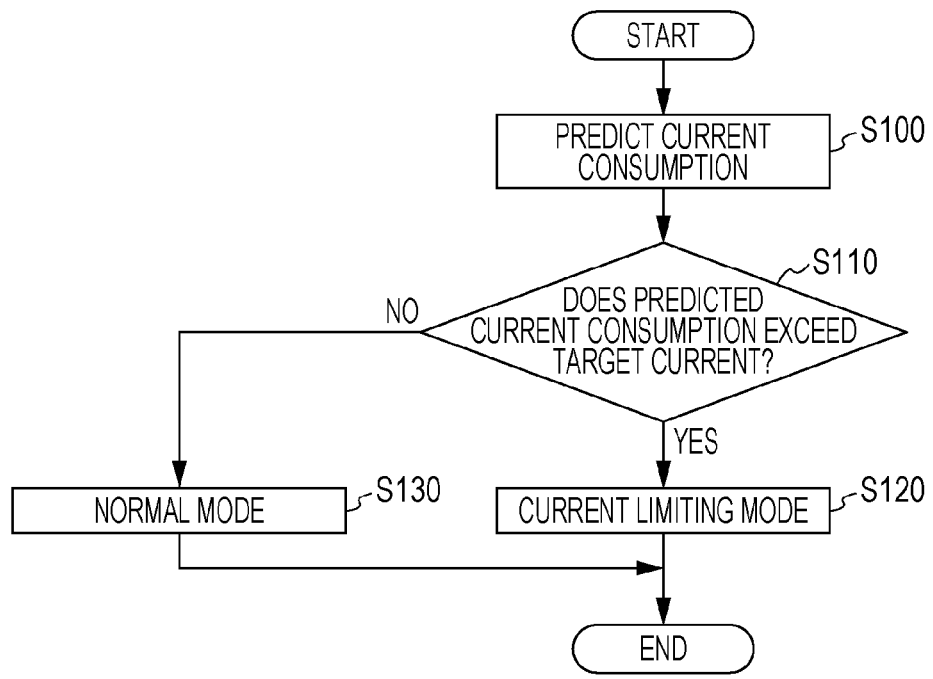
FIG. 4 is a flowchart illustrating a current control process in an audio apparatus according to the first embodiment.

FIG. 4 is a flowchart illustrating a current control process performed by an audio apparatus according to an embodiment of the present invention. When the operation of an audio apparatus is started, the current consumption prediction unit 52 predicts current consumption on the basis of a monitoring result of the output level monitoring unit 28 and a monitoring result of the power supply voltage monitoring unit 58 (S100). Subsequently, the limiter control unit 54 determines whether the predicted current consumption exceeds a target current (S110). As described previously, a target current is determined in accordance with the rated current of a fuse. For example, when the rated current of a fuse is 40 A, a target current may be set to a value equal to or less than 40 A, for example, 30 A. In a case where the limiter control unit 54 determines that the predicted current consumption exceeds the target current, the limiter control unit 54 selects a current limiting mode in which a current limiting is emphasized (S120). In a case where the limiter control unit 54 determines that the predicted current consumption does not exceed the target current, the limiter control unit 54 selects a normal mode in which a sound quality is emphasized (S130).

In the normal mode, the limiter control unit 54 outputs the limiter control signal S to the limiter 24 so as to control the limiter 24 using a threshold value and an attenuation speed determined in sound tuning. The gain adjustment unit 110 in the limiter 24 changes a threshold value and an attenuation speed in accordance with the received limiter control signal S. That is, in the normal mode, a threshold value is decreased and an attenuation speed is increased. As illustrated in FIGS. 3A and 3B, the gain adjustment unit 110 decreases the gain Gn in the case of the threshold value Th< the audio signal Sout and increases the gain Gn in the case of the threshold value Th> the audio signal Sout. An attenuation speed at the time of the decrease in the gain Gn depends on the level of the gain. For example, a gain Gn1=0.999 and a gain Gn2=0.9 are compared with each other. Since the gains Gn1 and Gn2 are less than 1, an audio signal is attenuated with both of them. Since the gain Gn1 is closer to 1 than the gain Gn2, attenuation is more slowly performed with the gain Gn1. That is, an attenuation speed at the time of employment of the gain Gn2 is higher than an attenuation speed at the time of employment of the gain Gn1. The increase in an attenuation speed leads to the occurrence of noise and the deterioration of sound quality. In the normal mode, in order not to deteriorate sound quality, an attenuation speed is set to a value equal to or larger than a predetermined value. For example, an attenuation speed is set to −0.32 dB/ms.

On the other hand, unlike in the normal mode in which sound quality is emphasized, in the current limiting mode, it is necessary to reduce current consumption as soon as possible to prevent the occurrence of a blowout of a fuse. Therefore, in the current limiting mode, a threshold value smaller than that in the normal mode and an attenuation speed higher than that in the normal mode are set. For example, an attenuation speed is changed from −0.32 dB/ms set in the normal mode to −10 dB/ms. A threshold value smaller than that in the normal mode is set, but is, more preferably, changed in accordance with the difference between the predicted current consumption and the target current. That is, the larger the predicted current consumption, the larger the amount of decrease in the threshold value. As a result, even if a large current flows, it is possible to rapidly reduce current consumption and prevent the occurrence of a blowout of a fuse.

Figure 5:
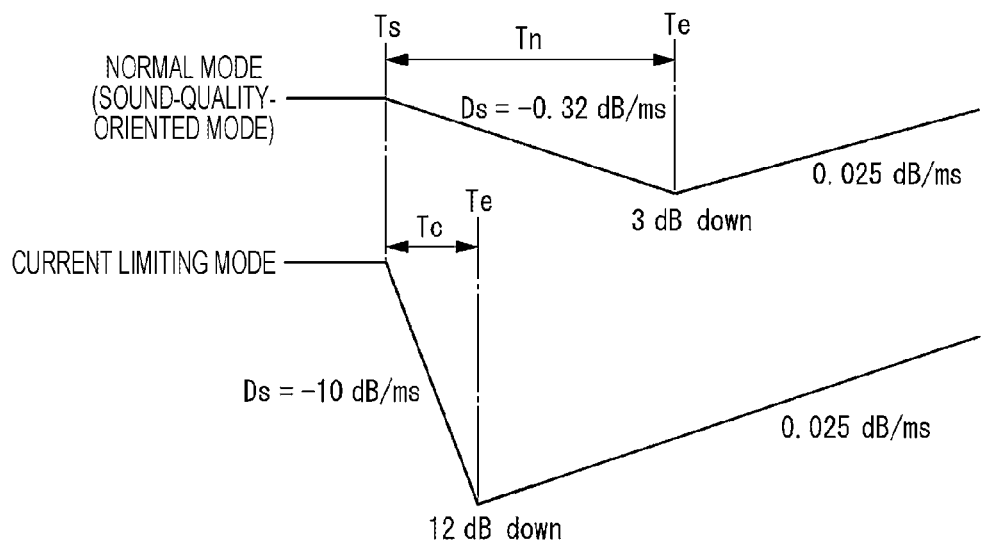
FIG. 5 is a schematic diagram illustrating the change in gain with time in a normal mode and a current limiting mode.

FIG. 5 is a schematic diagram illustrating the change in gain with time in the normal mode and the current limiting mode. In the drawing, Ts represents a time at which predicted current consumption exceeds a target current and Te represents a time at which a gain is changed from a negative value to a positive value. In the normal mode, when the audio signal Sout exceeds a threshold value Th_n (Th_n represents a threshold value set in the normal mode), the gain of the input audio signal Sin is reduced. The audio signal Sin is attenuated at an attenuation speed of −0.32 dB/ms, and the amount of attenuation becomes 3 dB at a time Te. Subsequently, when the audio signal Sout falls below the threshold value Th_n, the gain of the input audio signal Sin is increased and the audio signal Sin is amplified at an amplification speed of 0.025 dB/ms.

On the other hand, in the current limiting mode, when the audio signal Sout exceeds a threshold value Th_c (Th_c represents a threshold value set in the current limiting mode and is smaller than Th_n (Th_c<Th_n)), the gain of the audio signal Sin is reduced. The input audio signal Sin is attenuated at an attenuation speed of −10 dB/ms, and the amount of attenuation becomes 12 dB at the time Te. Subsequently, when the audio signal Sout falls below the threshold value Th_c, the gain of the audio signal Sin is increased and the audio signal Sin is amplified at an amplification speed of 0.025 dB/ms. The threshold value Th_c is preferably set in accordance with the difference between predicted current consumption and a target current.

In the current limiting mode, a period Tc from the time Ts at which a large current has been detected to the time Te at which the reduction in current consumption is completed can be made to be shorter than a period Tn in the normal mode. The attenuation speed set in the normal mode is high enough to prevent the deterioration of sound quality. However, in a case where a large current flows, the attenuation speed may be too low to reduce power consumption before the blowout of a fuse. In a case where the attenuation speed for the current limiting mode is set in the normal mode, the deterioration of sound quality occurs even when an apparatus consumes only a current consumption that is required for a normal operation and does not cause the blowout of a fuse. In this embodiment, the switching between the normal mode and the current limiting mode is performed in accordance with current consumption. A threshold value and an attenuation speed for a limiter are adjusted to prevent the occurrence of a blowout of a fuse at the time of large current consumption and the deterioration of sound quality at the time of small current consumption.

The limiter control unit 54 controls the limiter in the normal mode or the current limiting mode on the basis of a result of the determination of whether the predicted current consumption exceeds the target current. There are some methods of transition from the current limiting mode to the normal mode. In a first method, it is periodically determined whether the predicted current consumption exceeds the target current, and one of the current limiting mode and the normal mode is selected on the basis of a result of the determination. In the case of the first method, since the determination is performed at frequent intervals, processing becomes complicated. In a second method, in a case where the predicted current consumption has continuously fallen below the target current n times (n is a natural number equal to or greater than 2 and is set in advance) after the transition to the current limiting mode, the current limiting mode is automatically changed to the normal mode after a predetermined period, for example, 500 ms, has elapsed from the transition to the current limiting mode.

At the time of transition from the current limiting mode to the normal mode, an attenuation speed and a threshold value for the limiter may be changed to original values at that time. However, it is preferable that a threshold value be gradually changed. For example, at the time of transition to the normal mode, an attenuation speed is changed from −10 dB/ms set in the current limiting mode to −0.32 dB/ms. On the other hand, a threshold value is increased at a constant rate (for example, 5%) each time a predetermined period has elapsed from the elapse of a predetermined period Tx (for example, 500 ms) in a case where the predicted current consumption continuously falls below the target current n times.

Figure 6:
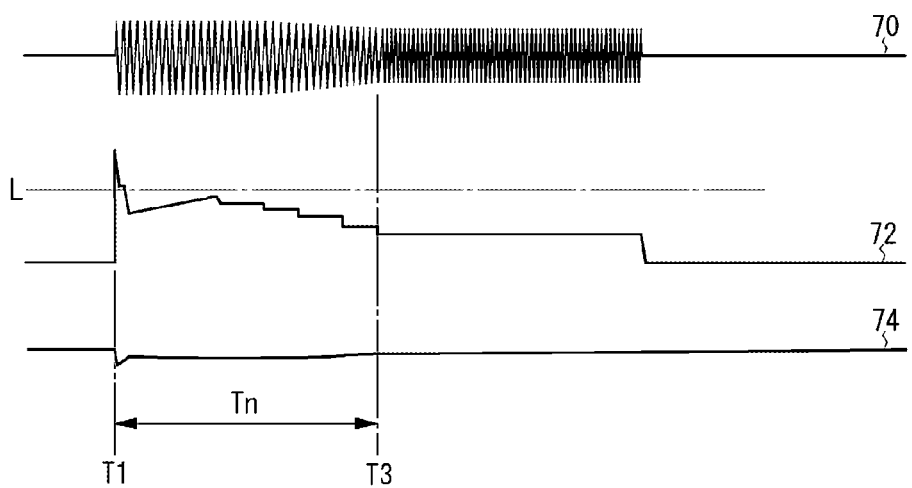
FIG. 6 is a diagram illustrating the waveform of each unit when current control is performed in an audio apparatus in the related art.
Figure 7:
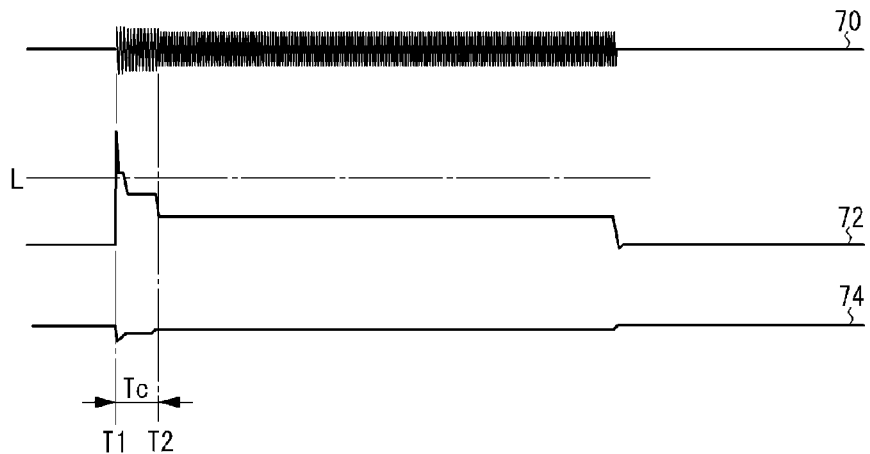
FIG. 7 is a diagram illustrating the waveform of each unit when current control is performed in an audio apparatus according to an embodiment of the present invention.

FIG. 6 is a diagram illustrating the output waveform of a speaker, the waveform of current consumption, and the waveform of a voltage of a battery when current control is performed in an audio apparatus in the related art. FIG. 7 is a diagram illustrating the output waveform of a speaker, the waveform of current consumption, and the waveform of a voltage of a battery when current control is performed in an audio apparatus according to an embodiment of the present invention. In FIGS. 6 and 7, 70 represents the output waveform (the amplitude of a voltage) of a speaker, 72 represents the waveform of current consumption or an output current, and 76 represents the waveform of a voltage of a battery.

In FIG. 6, it is assumed that a large current consumption exceeding a target current L occurs at a time T1 because of, for example, the output of rated power from all channels of the signal processor 20. At that time, a large voltage drop occurs in the waveform 74 of a voltage of a battery under the influence of the flow of a large current at the time T1. A limiter in the related art performs current control using an attenuation speed for a normal mode in which sound quality is emphasized and a fixed threshold value. Accordingly, current consumption gradually decreases and is stabilized at a substantially constant level at a time T3.

On the other hand, in this embodiment, as illustrated in FIG. 7, in a case where it is determined that current consumption exceeds the target current L, a limiter performs current control using an attenuation speed for the current limiting mode, that is, an attenuation speed higher than that in the normal mode, and a threshold value set in accordance with current consumption. Accordingly, current consumption relatively rapidly decreases from the time T1 and is stabilized at a substantially constant level at a time T2. In this embodiment, a period Tc (from the time T1 to the time T2) required for the completion of reduction in current consumption is markedly shortened as compared with a period Tn (from the time T1 to the time T3) required for the completion of reduction in current consumption in the related art. As a result, it is possible to prevent the occurrence of blowout of a fuse in an audio apparatus and obtain good sound quality in the normal mode in which current consumption is small.

Figure 8:
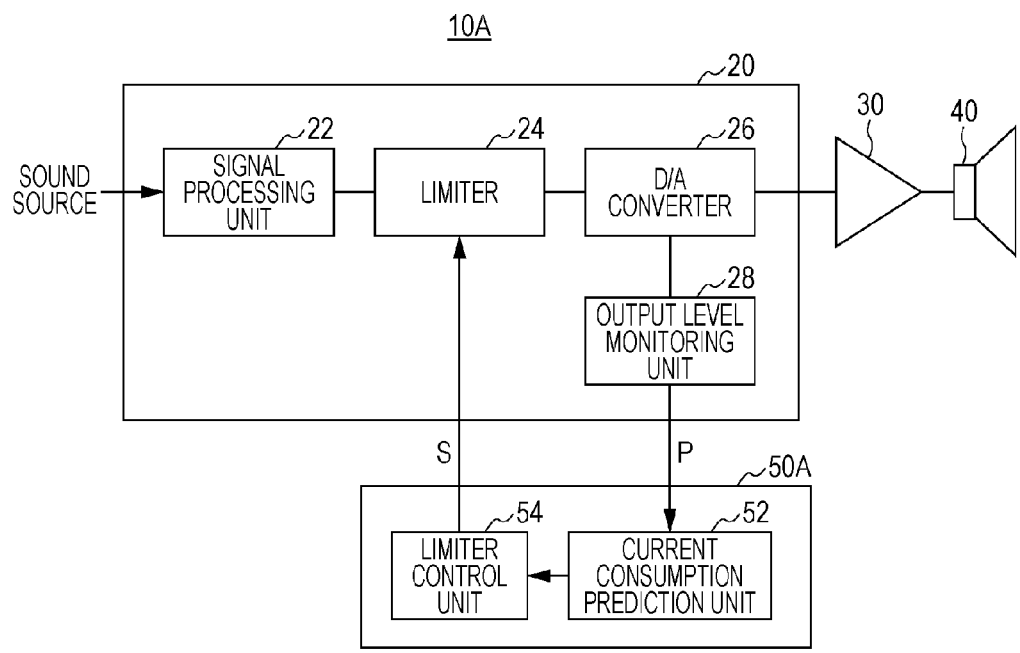
FIG. 8 is a block diagram illustrating an exemplary configuration of an audio apparatus according to a modification of the first embodiment.

In the first embodiment, the current consumption prediction unit 52 predicts current consumption using both a predicted current read out from the monitoring result P of the output level monitoring unit 28 and a weighting factor supplied from the weighting unit 60. However, the current consumption prediction unit 52 may predict current consumption without using information supplied from the weighting unit 60. FIG. 8 illustrates an audio apparatus 10A that predicts current consumption using the monitoring result P of the output level monitoring unit 28. That is, a controller 50A includes the current consumption prediction unit 52 and the limiter control unit 54, but does not include the speaker/amplifier information unit 56, the power supply voltage monitoring unit 58, and the weighting unit 60 used in the audio apparatus illustrated in FIG. 2. The current consumption prediction unit 52 predicts current consumption on the basis of the monitoring result P of the output level monitoring unit 28 and supplies the predicted current consumption to the limiter control unit 54. The limiter control unit 54 controls the limiter 24 in the normal mode or the current limiting mode on the basis of the predicted current consumption.

Figure 9:
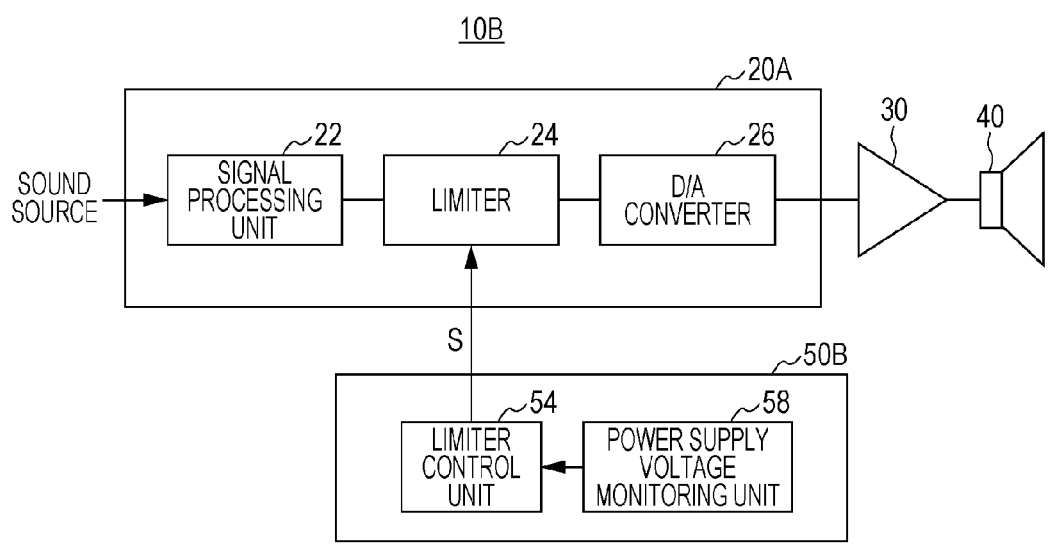
FIG. 9 is a block diagram illustrating an exemplary configuration of an audio apparatus according to a second embodiment of the present invention.

Next, a second embodiment of the present invention will be described. FIG. 9 illustrates the configuration of an audio apparatus according to the second embodiment. An audio apparatus 10B according to the second embodiment includes a signal processor 20A and a controller 50B. Unlike in the first embodiment, the signal processor 20A does not include the output level monitoring unit 28. Furthermore, unlike in the first embodiment, the controller 50B does not include the current consumption prediction unit 52, the speaker/amplifier information unit 56, and the weighting unit 60, and the limiter control unit 54 controls the limiter control unit 54 on the basis of a monitoring result of the power supply voltage monitoring unit 58.

Figure 10:
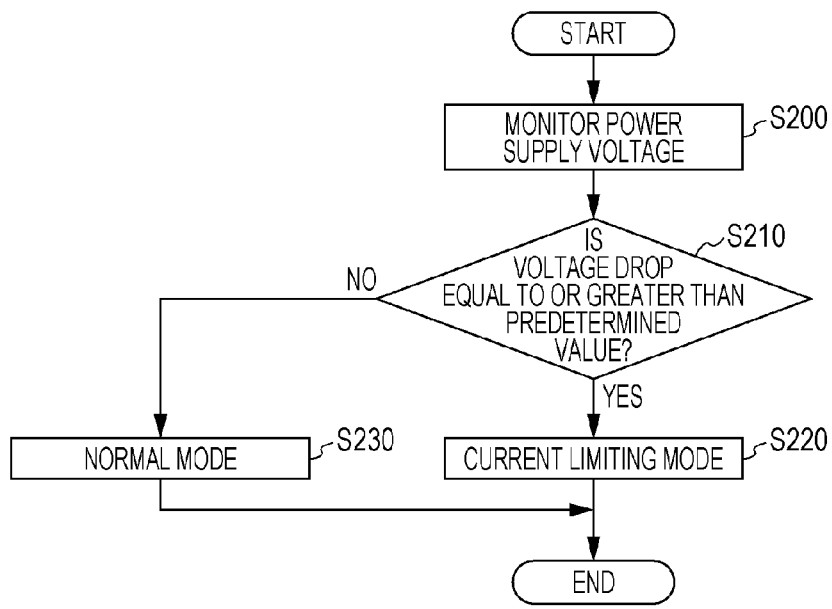
FIG. 10 is a flowchart illustrating a current control process in an audio apparatus according to the second embodiment.

FIG. 10 is a flowchart describing a current control process performed by an audio apparatus according to the second embodiment. The power supply voltage monitoring unit 58 monitors the voltage of a power-supply line extending from a battery to an audio apparatus at regular intervals of, for example, 1 ms (S200). Subsequently, the power supply voltage monitoring unit 58 detects whether a voltage drop at the power-supply line is equal to or larger than a predetermined value (S210). This predetermined value corresponds to the level of a voltage drop when a large current flows through the audio apparatus, that is, the level of a voltage drop when current consumption exceeds a target current. For example, in a case where a battery supplies a power supply voltage of 12 V, a voltage drop of approximately 1 V is detected. The power supply voltage monitoring unit 58 supplies a detection result to the limiter control unit 54. The limiter control unit 54 controls the limiter 24 in the current limiting mode in a case where it has been detected that a voltage drop is equal to or larger than the predetermined value (S220) and controls the limiter 24 in the normal mode in a case where it has not been detected that a voltage drop is equal to or larger than the predetermined value (S230).

Like in the first embodiment, in the current limiting mode, an attenuation speed higher than that in the normal mode, for example, an attenuation speed of −10 dB/ms is set. A threshold value is set in accordance with a power supply voltage monitored by the power supply voltage monitoring unit 58. More specifically, the larger the drop in power supply voltage, that is, the smaller the power supply voltage, the larger the current consumption. A threshold value is therefore decreased. The method of transition from the current limiting mode to the normal mode is the same as that described in the first embodiment.

Thus, according to the second embodiment, it is possible to perform current control in the normal mode or the current limiting mode by monitoring a power supply voltage without obtaining a predicted current from the signal processor 20A.

Figure 11:
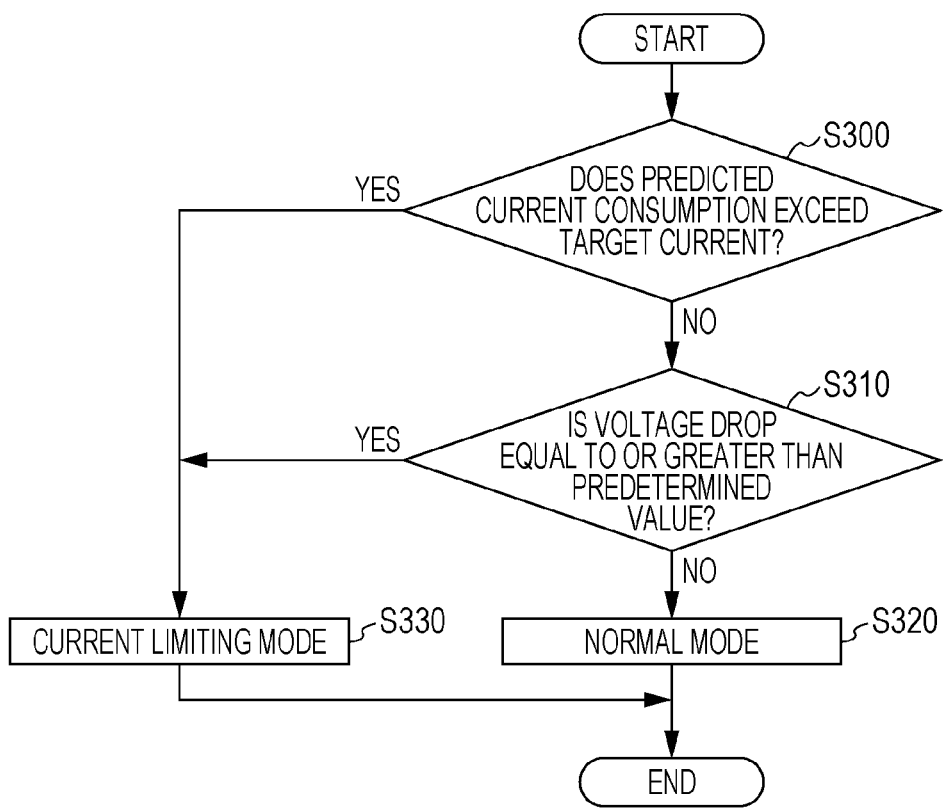
FIG. 11 is a flowchart illustrating a current control process in an audio apparatus according to a third embodiment of the present invention.

Next, a third embodiment of the present invention will be described. In a case where the controller 50 in an audio apparatus has a function of predicting current consumption on the basis of a predicted current read out from the signal processor 20 and a function of monitoring the power supply voltage of a battery, predicted current consumption and a monitored power supply voltage are independently determined to select one of the normal mode and the current limiting mode in the third embodiment. FIG. 11 is a flowchart describing a current control process according to the third embodiment. First, as described in the first embodiment, it is determined whether current consumption predicted by the current consumption prediction unit 52 exceeds a target current (S300). In a case where predicted current consumption exceeds the target current, the limiter control unit 54 controls the limiter 24 in the current limiting mode (S330). In a case where predicted current consumption does not exceed the target current, it is detected whether a voltage drop monitored by the power supply voltage monitoring unit is equal to or larger than a predetermined value as described in the second embodiment (S310). In a case where a monitored voltage drop is equal to or larger than the predetermined value, the limiter control unit 54 controls the limiter 24 in the current limiting mode (S330). In a case where the predicted current consumption does not exceed the target current and the monitored voltage drop is not equal to or larger than the predetermined value, the limiter control unit 54 controls the limiter 24 in the normal mode (S320). Thus, according to the third embodiment, in a case where one of predicted current consumption and a drop in power supply voltage satisfies the respective condition, the limiter 24 is controlled in the current limiting mode.

In the above-described embodiments, the functional configuration of the controller 50 has been described. However, the configuration can be realized by a program or software executed by the controller 50 or with the combination of software and hardware.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:
1. An audio apparatus comprising:
   an output unit configured to output an audio signal;
   a prediction unit configured to predict current consumption of the output unit;
   a determination unit configured to determine whether the predicted current consumption exceeds a target current;
   a limiting unit configured to limit the audio signal in a case where the audio signal exceeds a threshold value; and
   a control unit configured to control the limiting unit in a first mode in a case where it is determined that the predicted current consumption does not exceed the target current and control the limiting unit in a second mode in a case where it is determined that the predicted current consumption exceeds the target current,
   wherein, in the first mode, if the audio signal exceeds a first threshold value, the control unit causes the limiting unit to limit the audio signal at a first attenuation speed and, in the second mode, if the audio signal exceeds a second threshold value smaller than the first threshold value, the control unit causes the limiting unit to limit the audio signal at a second attenuation speed that is higher than the first attenuation speed.

2. The audio apparatus according to claim 1,
   wherein the limiting unit includes a limiter configured to limit a level of an input audio signal.

3. The audio apparatus according to claim 2,
   wherein the limiter includes an amplifier configured to attenuate or amplify an audio signal and a gain adjustment unit configured to compare an attenuated or amplified audio signal with the threshold value and adjust a gain of the amplifier on the basis of a comparison result, and
   wherein the control unit changes a threshold value for the gain adjustment unit and a gain of the gain adjustment unit in the second mode.

4. The audio apparatus according to claim 1, wherein the control unit changes the threshold value in accordance with a difference between the predicted current consumption and the target current.

5. The audio apparatus according to claim 1, wherein the prediction unit includes an output monitoring unit configured to monitor a signal output from a signal processing unit for processing an audio signal and predicts current consumption on the basis of a monitoring result of the output monitoring unit.

6. The audio apparatus according to claim 1, wherein the prediction unit includes a power supply voltage monitoring unit configured to monitor a voltage of a power-supply line to be supplied to the audio apparatus and predicts current consumption on the basis of a voltage monitored by the power supply voltage monitoring unit.

7. The audio apparatus according to claim 6,
   wherein the prediction unit detects the amount of voltage drop monitored by the power supply voltage monitoring unit, and wherein the control unit changes the threshold value in accordance with the detected amount of voltage drop.

8. The audio apparatus according to claim 6, wherein the prediction unit predicts current consumption on the basis of monitoring results of the output monitoring unit and the power supply voltage monitoring unit.

9. The audio apparatus according to claim 8, wherein the prediction unit includes a weighting unit configured to assign weights based on a monitoring result of the power supply voltage monitoring unit to current consumption predicted on the basis of a monitoring result of the output monitoring unit.

10. The audio apparatus according to claim 9,
wherein the output monitoring unit monitors a signal output from the signal processing unit at first intervals, and
wherein the power supply voltage monitoring unit monitors a voltage at second intervals shorter than the first interval.

11. The audio apparatus according to claim 10,
wherein the output unit includes an amplifier having a plurality of channels, and
wherein the prediction unit predicts power consumption on the basis of the number of channels used.

12. The audio apparatus according to claim 11, wherein the power-supply line is a power-supply line extending from a battery.

13. The audio apparatus according to claim 12,
wherein a fuse is provided at the power-supply line, and
wherein the target current is set in accordance with a rated current of the fuse.

14. A current control method in an audio apparatus including a processing unit for processing an audio signal, an output unit for outputting the audio signal processed by the processing unit, and a control unit for controlling the processing unit, comprising:

predicting current consumption of the output unit;
determining whether the predicted current consumption exceeds a target current; and
controlling the processing unit in a first mode in a case where it is determined that the predicted current consumption does not exceed the target current and controlling the processing unit in a second mode in a case where it is determined that the predicted current consumption exceeds the target current,
wherein, in the first mode, if the audio signal exceeds a first threshold value, the control unit causes the processing unit to limit the audio signal at a first attenuation speed, and, in the second mode, if the audio signal exceeds a second threshold value smaller than the first threshold value, the control unit causes the processing unit to limit the audio signal at a second attenuation speed that is higher than the first attenuation speed.

15. The current control method according to claim 14,
wherein the processing unit includes a limiter configured to limit a level of an input audio signal.

16. The current control method according to claim 14, wherein the control unit changes the threshold value in accordance with a difference between the predicted current consumption and the target current.

17. The current control method according to claim 14, wherein the act of predicting current consumption includes monitoring a signal output from a signal processing unit for processing an audio signal and predicting current consumption on the basis of a monitoring result.

18. The current control method according to claim 14, wherein the act of predicting current consumption includes monitoring a voltage of a power-supply line to be supplied to the audio apparatus and predicting current consumption on the basis of the monitored voltage.

* * * * *